US008811070B1

(12) United States Patent
Rai et al.

(10) Patent No.: US 8,811,070 B1
(45) Date of Patent: Aug. 19, 2014

(54) WRITE-TRACKING CIRCUITRY FOR MEMORY DEVICES

(71) Applicant: LSI Corporation, San Jose, CA (US)

(72) Inventors: Dharmendra Kumar Rai, Uttar Pradesh (IN); Rahul Sahu, Uttar Pradesh (IN)

(73) Assignee: LSI Corporation, San Jose, CA (US)

( * ) Notice: Subject to any disclaimer, the term of this patent is extended or adjusted under 35 U.S.C. 154(b) by 28 days.

(21) Appl. No.: 13/769,888

(22) Filed: Feb. 19, 2013

(51) Int. Cl.
*G11C 11/00* (2006.01)
*G11C 11/413* (2006.01)
*G11C 7/22* (2006.01)
*G11C 7/04* (2006.01)

(52) U.S. Cl.
CPC .............. *G11C 11/413* (2013.01); *G11C 7/227* (2013.01); *G11C 7/22* (2013.01); *G11C 7/04* (2013.01)
USPC .......................... 365/154; 365/194; 365/210.1

(58) Field of Classification Search
CPC ............ G11C 7/04; G11C 7/22; G11C 7/222; G11C 11/413; G11C 7/227
USPC ................. 365/194, 191, 154, 156, 205, 207, 365/210.1, 189.07, 189.09
See application file for complete search history.

(56) References Cited

U.S. PATENT DOCUMENTS

| 6,118,707 | A  | * | 9/2000  | Gould et al. ............. 365/189.08 |
| 6,643,204 | B1 |   | 11/2003 | Agrawal |
| 7,839,706 | B2 | * | 11/2010 | Chang ............................ 365/194 |
| 7,876,600 | B2 |   | 1/2011  | Zhang et al. |
| 7,969,193 | B1 | * | 6/2011  | Wu et al. .......................... 326/82 |
| 2013/0258794 | A1 | * | 10/2013 | Sharad et al. ................. 365/205 |
| 2013/0343139 | A1 | * | 12/2013 | Evans et al. .................... 365/194 |
| 2014/0029366 | A1 | * | 1/2014  | Trivedi et al. .............. 365/210.1 |
| 2014/0071775 | A1 | * | 3/2014  | Evans et al. .................... 365/194 |

OTHER PUBLICATIONS

Yang, S., et al., "Timing control degradation and NBTI/PBTI tolerant design for Write-replica circuit in nanoscale CMOS SRAM," VLSI Design, Automation and Test, 2009. VLSI-DAT '09. International Symposium on, vol., No., pp. 162-165, Apr. 28-30, 2009.

\* cited by examiner

*Primary Examiner* — Gene Auduong
(74) *Attorney, Agent, or Firm* — Mendelsohn, Drucker & Dunleavy, P.C.; Craig M. Brown; Steve Mendelsohn

(57) ABSTRACT

A write-tracking circuit for a writable memory array has one or more dummy memory cells and is configured to write different values to the one or more dummy memory cells. Durations of pulses applied to word lines of the memory array during write operations are controlled based on durations of writing the different values to the one or more dummy memory cells. In at least some embodiments, the write-tracking circuit is configured to write the different values to the one or more dummy memory cells during a single write operation. In at least some embodiments, the write-tracking circuit is configured to write the different values to at least one of the one or more dummy memory cells during different write operations.

17 Claims, 5 Drawing Sheets

WRITE-TRACKING CIRCUITRY FOR MEMORY DEVICES

BACKGROUND OF THE INVENTION

1. Field of the Invention

The present invention relates to the storage of data, and, more specifically but not exclusively, to writable memory devices such as static random-access memory (SRAM) devices.

2. Description of the Related Art

In a conventional SRAM device, bits of information are stored in an array of memory cells, where the memory cells are arranged in columns and rows. The memory cells in each row are coupled to a word line, and when a reading or writing operation is performed, a pulse is applied to the word line to turn on the access transistors of the memory cells in the row.

To ensure that the duration of the word-line pulse is appropriate (i.e., neither too long nor too short), conventional SRAM devices use tracking circuitry to simulate the amount of time needed to access the memory cells in a row. For example, for write operations, an SRAM device may implement write-tracking circuitry that simulates the amount of time needed for a write operation and to control the duration of the word-line pulse during write operations. If the pulse applied to the word line is not of sufficient time duration and appropriate state, then the writing operation could terminate before data is properly written to the memory array. If, on the other hand, the duration of the pulse applied to the word line is greater than needed, then the memory will be unnecessarily inhibited from continuing on to the next read or write operation, and the performance of the memory device will be unnecessarily slowed.

BRIEF DESCRIPTION OF THE DRAWINGS

Embodiments of the disclosure will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Figure 1:
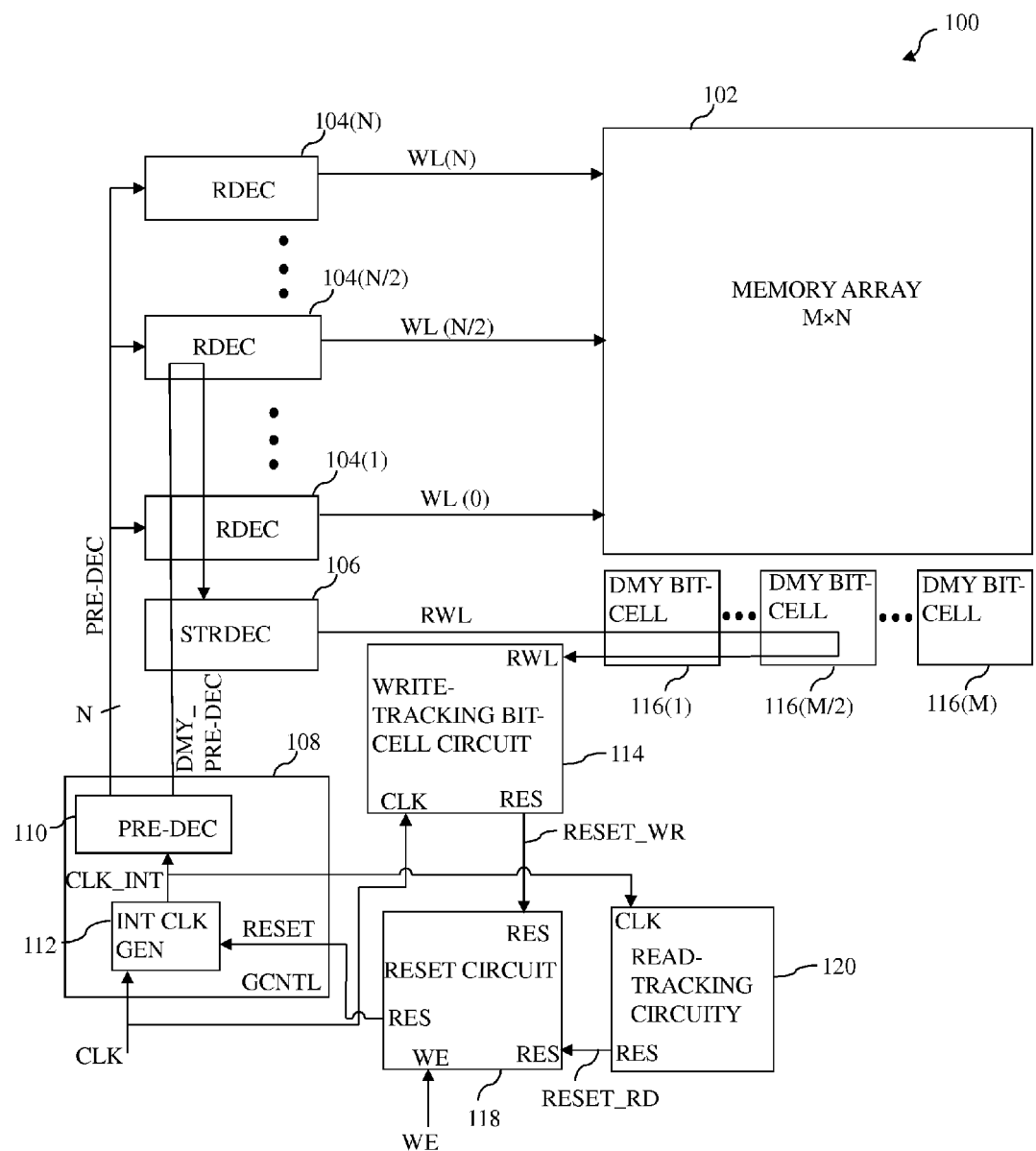
FIG. 1 shows a simplified block diagram of a memory device according to one embodiment of the disclosure.

FIG. 1 shows a simplified block diagram of a memory device 100 according to one embodiment of the disclosure. Memory device 100 may be implemented as a stand-alone chip or as memory in an embedded system. In general, when conditions are being established to write to a row of memory array 102, internal clock generator 112 of global controller 108 changes the state of the internal clock signal CLK_INT. Based on this change in state, pre-decoder 110 partially decodes the address of memory array 102 to which data is to be written (i.e., the write address). The partially-decoded write address is provided via N pre-decode lines PRE-DEC to row decoders 104(1)-104(N). Row decoders 104(1)-104(N) complete decoding of the partially-decoded write address, and the row decoder corresponding to the write address drives its corresponding word line WL.

The duration of the pulse applied to the word line is controlled by tracking circuitry comprising a dummy pre-decode line DMY_PRE-DEC, self-time row decoder 106, a reference-word line RWL, dummy bit-cells 116(1)-116(M), and write-tracking bit-cell circuit 114. This tracking circuitry simulates the amount of time that it takes to write a bit of information to memory array 102.

In general, pre-decoder 110 initiates the operations of the write-tracking circuitry by driving the dummy pre-decode line DMY_PRE-DEC, which simulates the resistive and capacitive properties of the pre-decode lines. The dummy pre-decode line DMY_PRE-DEC extends from pre-decoder 110 to the middle of the bank of row decoders (e.g., to row decoder 104(N/2)) and back to self-time row decoder 106 such that the length of the dummy pre-decode line DMY_PRE-DEC is approximately the same as the length of the longest pre-decode line PRE-DEC (i.e., the pre-decode line to row decoder 104(N)). Thus, self-time row decoder 106 should not begin driving the reference-word line RWL until the last row decoder 104(N) has received the partially-decoded write address.

The reference-word line RWL, which simulates the resistive and capacitive properties of the word lines WL in memory array 102, extends from self-time row decoder 106 to the middle of the row of dummy bit-cells (e.g., to dummy bit-cell 116(M/2)) and back to write-tracking bit-cell circuit 114 such that the length of the reference-word line RWL is approximately the same as the length of each word line WL of memory array 102. Thus, reference-word line RWL simulates the amount of time that it takes for the word-line pulse to reach the last bit-cell in the row of memory array 102 to which data is being written. Note that, in this embodiment, it is assumed that the word-line pulse is applied at one side of the memory array 102 and travels to the other side. However, according to alternative embodiments, the word-line pulse may be applied at another location of memory array 102, such as at the middle of the memory array. The length of the reference-word line RWL would be modified accordingly.

Write-tracking bit-cell circuit 114, the details of which are described in further detail below, comprises at least one dummy bit-cell that is similar to the bit-cells in memory array 102. Writing to the one or more dummy bit-cells simulates the amount of time that it takes to write to a bit-cell in memory array 102. In general, two different bit values are written to the one or more dummy bit-cells.

In at least some embodiments, the two different bit values are written during a single write cycle. In such embodiments, write-tracking bit-cell circuit 114 comprises two or more dummy bit-cells and concurrently writes different values (i.e., 0 and 1) to the two or more dummy bit-cells in each write cycle. Writing different values concurrently enables write-tracking bit-cell circuit 114 to account for situations when it takes longer to write a value of zero than a value of one, or vice versa. For instance, process, voltage, and temperature variations may cause systematic spatial variations that result in transistors across the chip having different threshold voltages. Such variations may result in it taking longer to write a value of zero than a value of one, or vice versa.

In at least some embodiments, the two different bit values are written to each of the one or more dummy bit-cells during adjacent write cycles. In such embodiments, write-tracking bit-cell circuit 114 alternates the value stored in each of the one or more dummy bit-cells such that each dummy bit-cell stores both values over two write cycles. Thus, in one write cycle, a dummy bit-cell stores a value of zero, and in the next write cycle, the same dummy bit-cell stores a value of one. As a result, the one or more dummy bit-cells of write-tracking bit-cell circuit 114 may be operated without using restoration circuitry that restores the dummy bit-cells to respective default states prior to a write operation. The elimination of restoration circuitry improves cycle time and reduces power consumption and chip area.

In at least some embodiments, the two previously described features are combined, such that the two different bit values are written to two or more dummy bit-cells during a single write cycle, and the two different bit values are written to each of the two or more dummy bit-cells during adjacent write cycles.

Once the bit value or values are written to all of the one or more dummy bit-cells of write-tracking bit-cell circuit 114 in a write cycle, write-tracking bit-cell circuit 114 changes the state of a write-reset signal RESET_WR. Reset circuit 118 receives the write-reset signal RESET_WR from write-tracking bit-cell circuit 114, a write-enable signal WE from other control circuitry (not shown), and a read-reset signal RESET_RD from read-tracking circuitry 120. Read-tracking circuitry 120 simulates the amount of time needed for a read operation and may be implemented using any suitable read-tracking technique.

When the write enable signal WE indicates that memory device 100 is in a write operation, reset circuit 118 changes the state of reset signal RESET based on a change of state in write-reset signal RESET_WR. When the write enable signal WE indicates that memory device 100 is not in a write operation, reset circuit 118 changes the state of reset signal RESET based on the read-reset signal RESET_RD. Reset signal RESET is used by internal clock generator 112 to change the state of the internal clock signal CLK_INT, which ultimately results in the termination of the word-line pulse applied to memory array 102.

Figure 2:
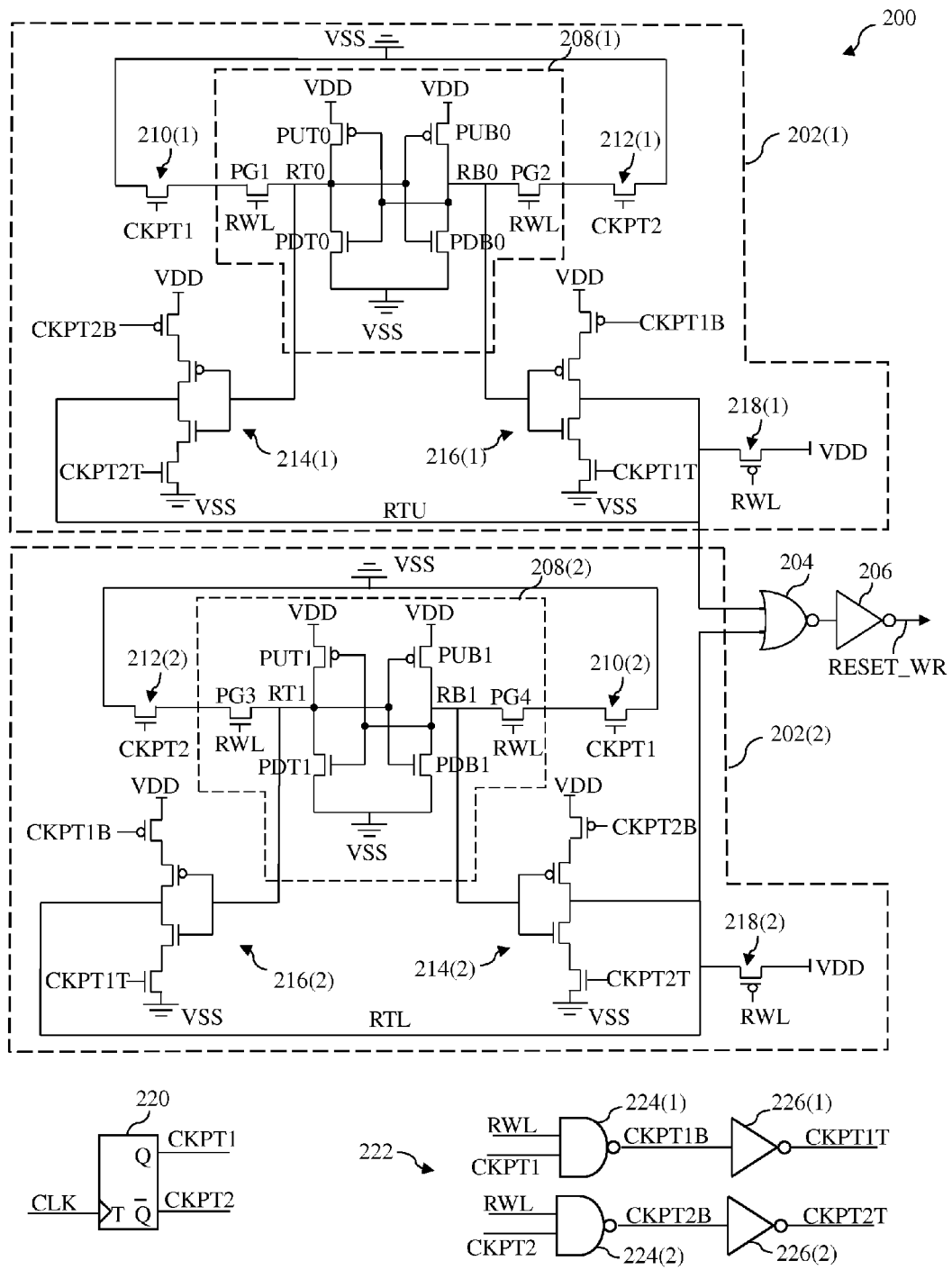
FIG. 2 shows a simplified schematic diagram of a write-tracking bit-cell circuit according one embodiment of the disclosure.

FIG. 2 shows a simplified schematic diagram of a write-tracking bit-cell circuit 200 according one embodiment of the disclosure. Write-tracking bit-cell circuit 200 may be used to implement write-tracking bit-cell circuit 114 of memory device 100 of FIG. 1 or a write-tracking bit-cell circuit in another memory device. In general, write-tracking bit-cell circuit 200 comprises first and second tracking cells 202(1) and 202(2), NOR gate 204, and inverter 206. During each write cycle, first tracking cell 202(1) writes a first bit value (i.e., 0 or 1) to a first dummy bit-cell 208(1) concurrently with second tracking cell 202(2) writing a second bit value (i.e., 1 or 0), opposite of the first bit value, to a second dummy bit-cell 208(2). Note that, as used herein, the term "concurrently" refers to overlapping durations of time, and does not necessarily indicate that the durations of time begin and end at the same time.

First and second dummy bit-cells 208(1) and 208(2) are configured identically to one another and to the bit-cells of the memory array (e.g., 102) so that (i) first dummy bit-cell 208(1) accurately simulates the amount of time that it takes to write the first bit value to a bit-cell in the memory array and (ii) second dummy bit-cell 208(2) accurately simulates the amount of time that it takes to write the second bit value to a bit-cell in the memory array. In this embodiment, each bit-cell is a six-transistor bit-cell comprising a pair of cross-coupled inverters coupled between two pass-gate transistors (i.e., PG1/PG2 and PG3/PG4).

In operation, once the first bit value is written to first dummy bit-cell 208(1), a reset signal RTU is driven low, indicating that sufficient time has passed to write the first bit value. Similarly, once the second bit value is written to second dummy bit-cell 208(2), a reset signal RTL is driven low, indicating that sufficient time has passed to write the second bit value. Once both reset signals RTU and RTL are driven low, NOR gate 204 drives its output low, indicating that sufficient time has passed to write both the first and second bit values. The output of NOR gate 204 is inverted by inverter 206 to generate write reset signal RESET_WR, which may be provided to, for example, reset circuit 118 of FIG. 1.

The values written to first and second dummy bit-cells 208(1) and 208(2) alternate from one write cycle to the next, such that values of one and zero are written to first and second dummy bit-cells 208(1) and 208(2), respectively, during one write cycle, and values of zero and one are written to first and second dummy bit-cells 208(1) and 208(2), respectively, during the next write cycle. The particular bit values written to first and second dummy bit-cells 208(1) and 208(2) are selected by bit-value selection circuitry. In this embodiment, transistors 210(1) and 212(1) and toggle flip-flop 220 make up the bit-value selection circuitry for first dummy bit-cell 208(1), and transistors 210(2) and 212(2) and toggle flip-flop 220 make up the bit-value selection circuitry for second dummy bit-cell 208(2).

Transistors 210(2) and 212(2) are configured in the mirror image of transistors 210(1) and 212(1) to enable the writing of opposite values to first and second dummy bit-cells 208(1) and 208(2) during each write cycle. Further, the use of flip-flop 220 enables the bit-values written to each of dummy bit-cells 208(1) and 208(2) to alternate from one write cycle to the next. For instance, suppose that, in one write cycle, clock signal CLK is driven high, and flip-flop 220 responds by driving bit-value selection signal CKPT1 high and bit-value selection signal CKPT2 low. In this scenario, transistor 210(1) is turned on, causing node RT0 of first dummy bit-cell 208(1) to be pulled low toward a low-voltage reference source VSS (e.g., ground), and transistor 212(1) is turned off, allowing first dummy bit-cell 208(1) to drive node RB0 high toward a high-voltage reference source VDD, such that a value of one is written to first bit-cell 208(1). Further, transistor 210(2) is turned on, causing node RB1 of second dummy bit-cell 208(2) to be pulled low toward the low-voltage reference source VSS, and transistor 212(2) is turned off, allowing second dummy bit-cell 208(2) to drive node RT1 high toward the high-voltage reference source VDD, such that a value of zero is written to second dummy bit-cell 208(2).

In the next write cycle, when the clock signal CLK is driven high, flip-flop 220 toggles the bit-value selection signals such that CKPT1 is driven low and CKPT2 is driven high. In this scenario, transistor 212(1) is turned on, causing node RB0 of first dummy bit-cell 208(1) to be pulled low, and transistor 210(1) is turned off, allowing first dummy bit-cell 208(1) to drive node RT0 high, such that a value of zero is written to first dummy bit-cell 208(1). Further, transistor 212(2) is turned on, causing node RT1 of second dummy bit-cell 208(2) to be pulled low, and transistor 210(2) is turned off, allowing second dummy bit-cell 208(2) to drive node RB1 high, such that a value of one is written to second dummy bit-cell 208(2).

The setting of reset signals RTU and RTL is controlled by reset-signal generation circuitry. In this embodiment, tri-state drivers 214(1) and 216(1), pre-charge transistor 218(1), and control signal circuitry 222 make up the reset-signal generation circuitry for first tracking cell 202(1), and tri-state drivers 214(2) and 216(2), pre-charge transistor 218(2), and control signal circuitry 222 make up the reset-signal generation circuitry for second tracking cell 202(2).

Control signal circuitry 222 comprises first and second processing paths. In the first processing path, tri-state control signal CKPT1B is generated by applying the reference-word line RWL and bit-value selection signal CKPT1 to NAND gate 224(1), and tri-state control signal CKPT1T is generated by applying tri-state control signal CKPT1B to inverter 226 (1). Similarly, in the second processing path, tri-state control signal CKPT2B is generated by applying the reference-word line RWL and bit-value selection signal CKPT2 to NAND gate 224(2), and tri-state control signal CKPT2T is generated by applying tri-state control signal CKPT2B to inverter 226 (2).

Before a writing operation (i.e., before the reference-word line RWL is driven high), reset signals RTU and RTL are driven high by pre-charge transistors 218(1) and 218(2), respectively. During a writing operation, the reference-word line RWL is driven high, the respective bit values are written to first and second dummy bit-cells 208(1) and 208(2), and pre-charge transistors 218(1) and 218(2) are turned off. Once a value is written to first dummy bit-cell 208(1), reset signal RTU is pulled low by either tri-state driver 214(1) or tri-state driver 216(1), depending on the value written to first dummy bit-cell 208(1). Similarly, once a value is written to second dummy bit-cell 208(2), reset signal RTL is pulled low by either tri-state driver 214(2) or tri-state driver 216(2), depending on the value written to second dummy bit-cell 208(2).

The particular tri-state drivers used to pull down reset signals RTU and RTL in each write cycle are selected based on the values of bit-value selection signals CKPT1 and CKPT2, and consequently, the values written to first and second dummy bit-cells 208(1) and 208(2). When bit-value selection signal CKPT1 is driven high, such that nodes RT0 and RB1 are drawn down (i.e., a one and zero are written, respectively), tri-state control signal CKPT1T is driven high, such that tri-state drivers 216(1) and 216(2) pull reset signals RTU and TRL low, respectively. When bit-value selection signal CKPT2 is driven high, such that nodes RB0 and RT1 are drawn down (i.e., a zero and one are written, respectively), tri-state control signal CKPT2T is driven high, such that tri-state drivers 214(1) and 214(2) pull reset signals RTU and TRL low, respectively. To further understand the operation of write-tracking circuit 200, consider FIG. 3.

Figure 3:
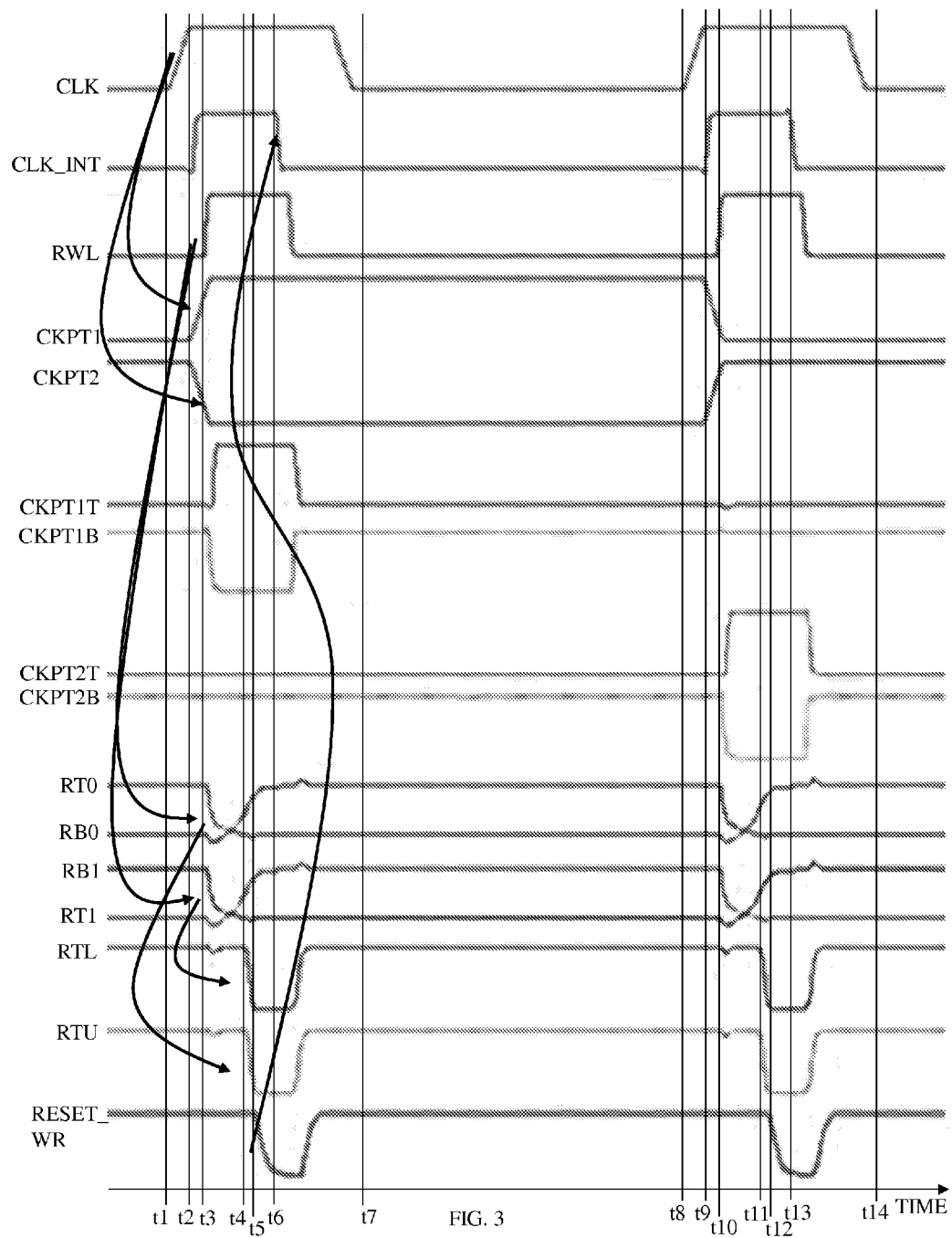
FIG. 3 shows a timing diagram of two exemplary writing cycles that may be performed by the write-tracking bit-cell circuit of FIG. 2.

FIG. 3 shows a timing diagram of two exemplary writing cycles that may be performed by write-tracking bit-cell circuit 200 of FIG. 2. Note that, with the exceptions of signals RT0 and RB0 and signals RT1 and RB1, the signals in FIG. 3 are artificially shown vertically offset from one another to more clearly illustrate the operations of write-tracking bit-cell circuit 200. In the first write cycle, values of one and zero are written to first and second dummy bit-cells 208(1) and 208(2), respectively, and, in the second cycle, values of zero and one are written to first and second dummy bit-cells 208(1) and 208(2), respectively.

Before the first cycle is initiated at time t1, the clock signal CLK, and consequently the internal clock signal CLK_INT and reference-word line RWL are all low. As a result of the reference-word line RWL being low, the pass-gate transistors PG1, PG2, PG3, and PG4 of dummy bit-cells 208(1) and 208(2) are turned off such that first dummy bit-cell 208(1) is isolated from transistors 210(1) and 212(1), and second dummy bit-cell 208(2) is isolated from transistors 210(2) and 212(2). Further, pre-charge transistors 218(1) and 218(2) are turned on such that reset signals RTU and RTL are pre-charged to the high voltage reference source VDD.

At time t1, the clock signal CLK is driven high, causing flip-flop 220 to toggle the bit-value selection signals, such that CKPT1 is driven high, and CKPT2 is driven low. As a result, transistors 210(1) and 210(2) are turned on, and transistors 212(1) and 212(2) are turned off. Driving clock signal CLK high also causes the internal clock signal INT_CLK, and ultimately the reference-word line RWL to go high at times t2 and t3, respectively.

As the reference-word line RWL goes high, several things occur. First, the pass-gate transistors PG1, PG2, PG3, and PG4 of first and second dummy bit-cells 208(1) and 208(2) turn on. Since transistors 210(1) and 210(2) are on as described above, nodes RT0 and RB1 are pulled low beginning just after time t3, causing first and second dummy bit-cells 208(1) and 208(2) to drive nodes RB0 and RT1 high, respectively, shortly thereafter. Second, the pre-charge transistors 218(1) and 218(2) turn off. Third, control signal circuitry 222 drives tri-state control signal CKPT1B low and tri-state control signal CKPT1T high, such tri-state drivers 216(1) and 216(2) connect to the low-voltage reference source VSS shortly after time t3, causing reset signals RTU and RTL to pull low at about time t4.

Note that the first write cycle of FIG. 3 does not show any visible difference between the amount of time that it takes for a one to be written to first dummy bit-cell 208(1) and a zero to be written to second dummy bit-cell 208(2). However, in an actual implementation, there may be a difference in these times due to, for example, systematic spatial variations across the chip.

For instance, suppose that the transistor speed decreases from left to right such that pass-gate transistors PG2 and PG4 on the right side are slower than pass-gate transistors PG1 and PG3 on the left side. When writing a one to dummy bit-cell 208(1), pass-gate transistor PG1, pull-up transistor PUB0, and pull-down transistor PDT0 are used, and when writing a zero to dummy bit-cell 208(2), pass-gate transistor PG4, pull-up transistor PUT1, and pull-down transistor PDB1 are used. Since bit-cell 208(2) uses a slower pass-gate transistor (i.e., PG4) and dummy bit-cell 208(1) uses a faster pass-gate transistor (i.e., PG1), writing a zero to dummy bit-cell 208(2) will be slower than writing a one to dummy bit-cell 208(1).

After both of reset signals RTU and RTL are pulled low, the write reset signal RESET_WR is pulled low at time t5, and the internal clock generator (e.g., 112) drives the internal clock signal INT_CLK low at time t6. Between times t6 and t7, the clock signal CLK, reference-word line RWL, tri-state driver control signals CKPT1B and CKPT1T, and reset signals RTU, RTL, and RESET_WR return to their respective states prior to time t1.

Note, however, that, since the values written to first and second dummy bit-cells 208(1) and 208(2) alternate in the next write cycle using the bit selection circuitry discussed above, nodes RT0, RB0, RT1, and RB1 are not returned to their respective states prior to time t1. As a result, dummy bit-cells 208(1) and 208(2) may be operated without using restoration circuitry that restores the bit-cells to respective default states prior to each write operation. The elimination of restoration circuitry improves cycle time and reduces power consumption and chip area.

At time t8, the clock signal CLK is driven high to initiate the second write cycle, causing flip-flop 220 to toggle the bit-value selection signals, such that CKPT1 is driven low and CKPT2 is driven high. As a result, transistors 210(1) and 210(2) are turned off, and transistors 212(1) and 212(2) are turned on. Driving clock signal CLK high also causes the internal clock signal INT_CLK, and ultimately the reference-word line RWL to go high at times t9 and t10, respectively.

Similar to the first write cycle, as the reference-word line RWL goes high, several things occur. First, the pass-gate transistors PG1, PG2, PG3, and PG4 of first and second dummy bit-cells 208(1) and 208(2) turn on. Since transistors 212(1) and 212(2) are on, as describe above, nodes RB0 and RT1 are pulled low beginning just after time t10, causing first and second dummy bit-cells 208(1) and 208(2) to drive nodes RT0 and RB1 high, respectively. Second, the pre-charge transistors 218(1) and 218(2) turn off. Third, control signal circuitry 222 drives tri-state control signal CKPT2B low and tri-state control signal CKPT2T high, such tri-state drivers 214(1) and 214(2) connect to the low-voltage reference source VSS shortly after time t10, causing reset signals RTU and RTL to pull low at about time t11.

Similar to the first write cycle, the second write cycle of FIG. 3 does not show any visible difference between the amount of time that it takes for a zero to be written to first dummy bit-cell 208(1) and a one to be written to second dummy bit-cell 208(2). However, in an actual implementation, there may be a difference in these times as described above.

After both of reset signals RTU and RTL are pulled low, the write-reset signal RESET_WR is pulled low at time t12, and the internal clock generator (e.g., 112) drives the internal clock signal INT_CLK low at time t13. Between times t13 and t14, the clock signal CLK, reference-word line RWL, tri-state driver control signals CKPT1B and CKPT1T, and reset signals RTU, RTL, and RESET_WR return to their respective states prior to time t8. However, since the values written to first and second dummy bit-cells 208(1) and 208(2) alternate in the next write cycle, nodes RT0, RB0, RT1, and RB1 are not returned to their respective states between times t7 and t8.

Although an embodiment of a write-tracking bit-cell circuit was shown in FIG. 2 that comprises two tracking cells 202(1) and 202(2), each having one dummy bit-cell 208(1) and 208(2), respectively, embodiments of disclosure are not so limited. According to alternative embodiments, write-tracking bit-cell circuits of the disclosure may have only one tracking cell. For instance, a write-tracking bit-cell circuit of the disclosure may comprise either tracking cell 202(1) or tracking cell 202(2), and the reset signal of that tracking cell (i.e., RTU or RTL) may be output to downstream processing (e.g., reset circuit 118 of FIG. 1). Further, according to alternative embodiments, write-tracking bit-cell circuits of the disclosure may have tracking cells that comprise more than one bit-cell. As an example, consider FIG. 4.

Figure 4:
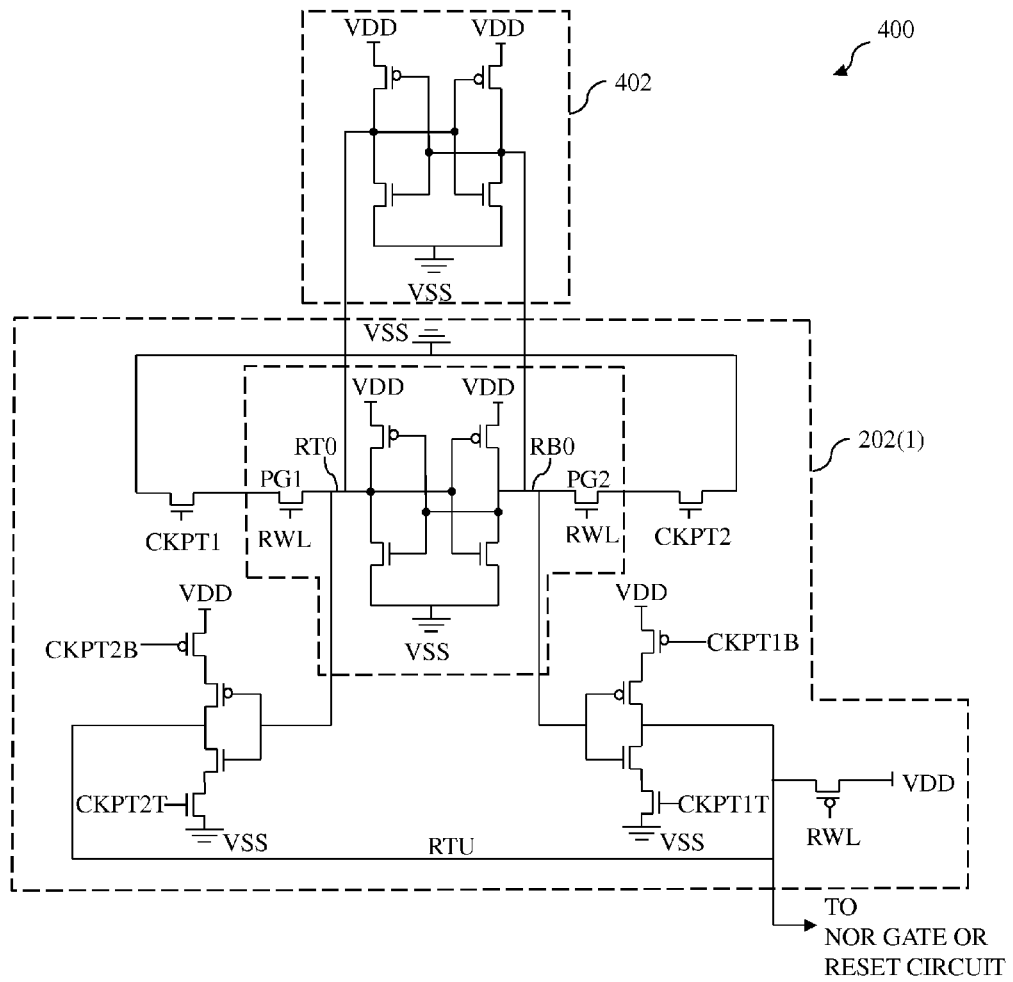
FIG. 4 shows a simplified schematic diagram of a tracking cell according to another embodiment of the disclosure.

FIG. 4 shows a simplified schematic diagram of a tracking cell 400 according to another embodiment of the disclosure. Tracking cell 400 is identical to tracking cell 202(1) of FIG. 2 with one exception: tracking cell 400 comprises an additional bit-cell 402, which can further account for systematic spatial variations on the chip. Note that tracking cell 202(2) of FIG. 2 may be implemented with an additional bit-cell in a manner similar to that of tracking cell 400.

Figure 5:
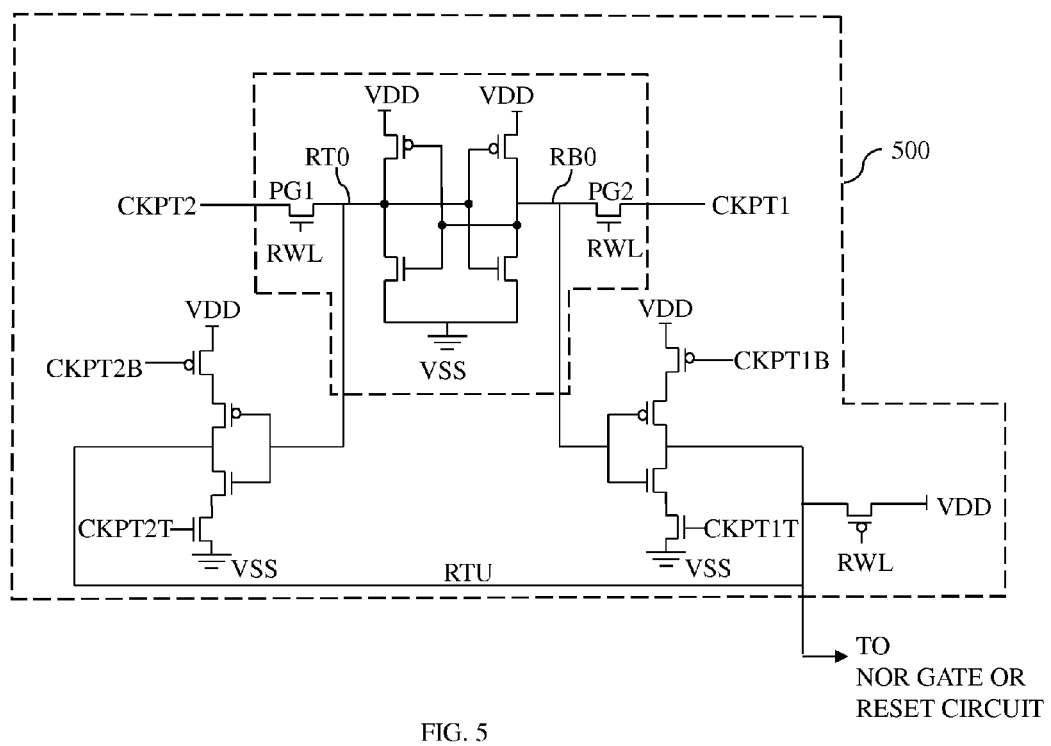
FIG. 5 shows a simplified schematic diagram of a tracking cell according to another embodiment of the disclosure.

According to alternative embodiments, write-tracking bit-cell circuits of the disclosure may be implemented using bit-selection circuitry other than that described above in relation to FIG. 2. As an example, consider FIG. 5, which shows a simplified schematic diagram of a tracking cell 500 according to another embodiment of the disclosure. Tracking cell 500 is similar to tracking cell 202(1) of FIG. 2; however, the bit-selection circuitry of tracking cell 500 does not comprise transistors 210(1) and 210(2) coupled to the low-voltage reference source VSS. Instead, bit-value selection signals CKPT1 and CKPT2 are provided directly to the channels of pass-gate transistors PG2 and PG1, respectively. Note that, tracking cell 202(2) of FIG. 2 may be modified in a similar manner to generate a complement tracking cell to tracking cell 500.

Although embodiments have been described as having bit-selection circuitry (e.g., flip-flop 220, transistors 210(1) and 212(1)) that alternates the values written to each tracking cell, embodiments of the disclosure are not so limited. According to some embodiments of the disclosure, alternative values may be written to two separate tracking cells in each write cycle, and the value written to each tracking cell in each write cycle can be the same. Such embodiments may be implemented using restoration circuitry such as that discussed in U.S. Pat. No. 6,643,204, the teachings of all of which are incorporated herein by reference in their entirety. Such embodiments would also eliminate the need for two tri-state drivers in each tracking cell. For instance, if a one and a zero are written every write cycle to tracking cells 202(1) and 202(2), respectively, then tri-state drivers 214(1) and 214(2) are not needed.

According to alternative embodiments of the disclosure, write-tracking bit-cell circuits may be implemented using types of memory cells other than the six-transistor bit-cells used in FIG. 2, including those that use more than or few than six transistors, and those that store more than one bit at a time.

While the exemplary embodiments of the disclosure have been described with respect to processes of circuits, including possible implementation as a single integrated circuit, a multi-chip module, a single card, or a multi-card circuit pack, the invention is not so limited. As would be apparent to one skilled in the art, various functions of circuit elements may also be implemented as processing blocks in a software program. Such software may be employed in, for example, a digital signal processor, micro-controller, or general purpose computer.

The invention can be embodied in the form of methods and apparatuses for practicing those methods.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An apparatus comprising:
   a memory array of memory cells arranged in at least one row;
   a word line configured to control access to the memory cells in the at least one row; and
   a write-tracking circuit comprising one or more dummy memory cells, wherein:
      the write-tracking circuit is configured to write a first value and a second value, different from the first value, to the one or more dummy memory cells; and
      durations of pulses applied to the word line during write operations of the memory array are controlled based on durations of writing the first and second values to the one or more dummy memory cells.

2. The apparatus of claim 1, wherein the write-tracking circuit is configured to write (i) the first value to a first dummy memory cell during a first write operation of the write-tracking circuit and (ii) the second value to the first dummy memory cell during a second write operation of the write-tracking circuit, subsequent to the first write operation.

3. The apparatus of claim 2, further comprising reset-signal generation circuitry configured to control a reset signal based on durations of writing the first and second values to the first dummy memory cell, wherein durations of the pulses applied to the word line during write operations are controlled based on the reset signal.

4. The apparatus of claim 2, wherein:
   the one or more dummy memory cells comprise at least the first dummy memory cell and a second dummy memory cell; and
   the write-tracking circuit is further configured to write (i) the second value to the second dummy memory cell during the first write operation of the write-tracking circuit and (ii) the first value to the second dummy memory cell during the second write operation of the write-tracking circuit.

5. The apparatus of claim 1, wherein the write-tracking circuit comprises bit-value selection circuitry configured to alternate writing of the first and second values to the one or more dummy cells during successive write operations.

6. The apparatus of claim 5, wherein the bit-value selection circuitry comprises a toggle flip-flop configured to alternate writing of the first and second values to the one or more dummy cells during successive write operations.

7. The apparatus of claim 1, wherein:
   the one or more dummy memory cells comprise at least first and second dummy memory cells; and
   the write-tracking circuit is configured to write (i) the first value to the first dummy memory cell and (ii) the second value to the second dummy memory cell during a single write operation of the write-tracking circuit.

8. The apparatus of claim 7, further comprising:
   reset-signal generation circuitry configured to control (i) a first reset signal based on duration of writing the first value to the first dummy memory cell and (ii) a second reset signal based on duration of writing the second value to the second dummy memory cell; and
   reset-signal selection circuitry configured to generate a write-reset signal based on the first and second reset signals, wherein a duration of a pulse applied to the word line during a write operation of the write-tracking circuit is controlled based on the write-reset signal.

9. The apparatus of claim 1, wherein the apparatus is an integrated circuit.

10. The apparatus of claim 1, wherein the apparatus is a static random-access memory device.

11. A method for operating an apparatus comprising a memory array of memory cells arranged in at least one row, the method comprising:
   (a) writing a first value and a second value, different from the first value, to one or more dummy cells; and
   (b) controlling durations of pulses applied to a word line of the memory array during write operations based on durations of writing the first and second values to the one or more dummy memory cells.

12. The method of claim 11, wherein step (a) comprises:
   (ai) writing the first value to a first dummy memory cell during a first write operation of the memory array; and
   (aii) writing the second value to the first dummy memory cell during a second write operation of the memory array, subsequent to the first write operation.

13. The method of claim 12, wherein step (b) comprises:
   (bi) controlling a reset signal based on durations of writing the first and second values to the first dummy memory cell; and
   (bii) controlling the durations of the pulses applied to the word line during write operations of the memory array based on the reset signal.

14. The method of claim 12, wherein:
   the one or more dummy memory cells comprise at least the first dummy memory cell and a second dummy memory cell;
   step (ai) further comprises writing the second value to the second dummy memory cell during the first write operation of the memory array; and
   step (aii) further comprises writing the first value to the second dummy memory cell during the second write operation of the memory array.

15. The method of claim 11, wherein:
   the one or more dummy memory cells comprise at least first and second dummy memory cells; and
   step (a) comprises writing (i) the first value to the first dummy memory cell and (ii) the second value to the second dummy memory cell during a single write operation of the memory array.

16. The method of claim 15, wherein step (b) comprises:
(bi) controlling (i) a first reset signal based on duration of writing the first value to the first dummy memory cell and (ii) a second reset signal based on duration of writing the second value to the second dummy memory cell;
(bii) controlling a write-reset signal based on the first and second reset signals; and
(biii) controlling duration of a pulse applied to the word line during a write operation of the memory array based on the write-reset signal.

17. The method of claim 11, wherein the apparatus is a static random-access memory device.

* * * * *